United States Patent
Li et al.

(10) Patent No.: US 8,872,588 B2
(45) Date of Patent: Oct. 28, 2014

(54) AMPLIFIER

(75) Inventors: Kim Li, Sheffield (GB); Simon Peter Goddard, Sheffield (GB)

(73) Assignee: NXP, B.V., Eindhoven (NL)

( * ) Notice: Subject to any disclaimer, the term of this patent is extended or adjusted under 35 U.S.C. 154(b) by 21 days.

(21) Appl. No.: 13/413,899

(22) Filed: Mar. 7, 2012

(65) Prior Publication Data

US 2012/0235746 A1 Sep. 20, 2012

(30) Foreign Application Priority Data

Mar. 15, 2011 (EP) .................................... 11158248

(51) Int. Cl.
| | | |
|---|---|---|
| H03F 3/45 | (2006.01) | |
| H03F 3/72 | (2006.01) | |
| H03F 3/217 | (2006.01) | |
| H03F 1/02 | (2006.01) | |
| H03F 3/24 | (2006.01) | |
| H03F 3/193 | (2006.01) | |

(52) U.S. Cl.
CPC .............. H03F 3/45188 (2013.01); H03F 3/72 (2013.01); H03F 3/2176 (2013.01); H03F 2200/18 (2013.01); H03F 2203/45231 (2013.01); H03F 2200/391 (2013.01); H03F 2203/7236 (2013.01); H03F 2203/45371 (2013.01); H03F 1/0261 (2013.01); H03F 3/245 (2013.01); H03F 3/193 (2013.01); H03F 2200/411 (2013.01); H03F 2203/45481 (2013.01)
USPC .......................................... 330/261; 330/296

(58) Field of Classification Search
USPC ................. 330/252–261, 207 A, 10, 251, 311
See application file for complete search history.

(56) References Cited

U.S. PATENT DOCUMENTS

| | | | |
|---|---|---|---|
| 6,104,246 A | 8/2000 | LaFerrara et al. | |
| 6,600,377 B2 | 7/2003 | Sasaki | |
| 7,315,204 B2 * | 1/2008 | Seven | 330/51 |
| 7,518,446 B2 | 4/2009 | Hau | |
| 7,579,908 B2 * | 8/2009 | Miaille et al. | 330/10 |
| 8,131,315 B2 * | 3/2012 | Tam | 455/553.1 |
| 8,150,343 B2 * | 4/2012 | Ramachandra Reddy | 455/127.2 |
| 8,344,801 B2 * | 1/2013 | Owen et al. | 330/251 |
| 2006/0217090 A1 | 9/2006 | Pan | |
| 2010/0130249 A1 | 5/2010 | Tam | |

FOREIGN PATENT DOCUMENTS

| | | |
|---|---|---|
| CN | 1274991 A | 11/2000 |
| CN | 1407716 A | 4/2003 |
| CN | 101438492 A | 5/2009 |
| CN | 101490943 A | 7/2009 |
| EP | 1 705 800 A2 | 9/2006 |
| WO | 2007/139401 A2 | 5/2007 |

OTHER PUBLICATIONS

Sokal, Nathan O.; "Class E—A New Class of High-efficiency Tuned Single-ended Switching Power Amplifiers"; IEEE J. Solid State Circuits, vol. 10, No. 3; pp. 168-176 (Jun. 1975).

(Continued)

*Primary Examiner* — Hieu Nguyen

(57) ABSTRACT

An amplifier comprising at least one amplifying element (20*a*, 25*a*) and a biasing circuit (32*a*, 32*b*) for biasing the or each amplifying element with a bias voltage is disclosed. The biasing circuit (32*a*, 32*b*) is adapted to vary the bias voltage such that the or each amplifying element switches between non-switching and switching modes of operation in response to a bias control signal (4) passing through a threshold value.

17 Claims, 4 Drawing Sheets

(56) References Cited

OTHER PUBLICATIONS

Yoo, Changsik, et al.; "A Common-gate Switched 0.9-W Class-E Power Amplifier with 41% PAE in 0.25 µm CMOS"; IEEE J. Solid State Circuits, vol. 36, No. 5; pp. 823-830 (May 2001).

Kang, Daehyun, et al.; "A Highly Efficient and Linear Class-AB/F Power Amplifier for Multimode Operation"; IEEE Trans. On Microwave Theory and Techniques, vol. 56, No. 1; IEEE Service Center, Piscataway, NJ, US; pp. 77-87 (Jan. 1, 2008).

Medina, M.A Yarleque'., et al.; "WiMAX Class AB and Class E Power Amplifier Design Using Equivalent Capacitance Concept"; Int'l J. of RF and Microwave Computer-Aided Engineering, vol. 18, No. 6; Wiley, New York, NY, US; pp. 543-551 (Nov. 1, 2008).

Koo, Bonhoon, et al.; "A CMOS Power Amplifier for WCDMA/GSM Handset Applications"; 2009 IEEE Topical Symposium on Power Amplifier for Wireless Communications; pp. 1-2; (Jan. 19, 2009) Retrieved from the Internet: http://pasymposium.ucsd.edu/papers2009/PASP_2_01.pdf Feb. 22, 2012.

Kim, Hyungwook, et al.; "A Fully Integrated CMOS RF Power Amplifier with Tunable Matching Network for GSM/EDGE Dual-mode Application"; Microwave Symposium Digest, IEEE, Piscataway, NJ, US; pp. 800-803; (May 23, 2010).

Extended European Search Report for European patent appln. No. 11158248.2 (Jan. 25, 2012).

Office Action from counterpart application CN 201210063002.6 (Jul. 1, 2014).

* cited by examiner

AMPLIFIER

CROSS-REFERENCE TO RELATED APPLICATIONS

This application claims the priority under 35 U.S.C §119 of European patent application no. 11158248.2, filed on Mar. 15, 2011, the contents of which are incorporated by reference herein.

The invention relates to an amplifier, typically a radiofrequency (RF) amplifier.

RF amplifiers are used in a variety of applications. An example application is IEEE802.15.4. This specifies multiple output powers from a radio module. For example, output powers of 2.5 dBm are used in a low-power mode, whereas 10 dBm and 18 dBm output powers are used in medium-power and high-power modes.

Typically, these multiple output powers are achieved by providing a basic RF amplifier module to provide an output power of 2.5 dBm along with either one or two additional power amplifier modules to boost this to 10 dBm or 18 dBm. This, however, is quite a cumbersome approach, requiring two additional amplifiers in the high power mode. Separate RF output pins are also required for each of the different power modes.

Furthermore, it is difficult to maintain precise control of power gain over the range of output powers with this approach.

In accordance with a first aspect of the invention, there is provided an amplifier comprising at least one amplifying element and a biasing circuit for biasing the or each amplifying element with a bias voltage, wherein the biasing circuit is adapted to vary the bias voltage such that the or each amplifying element switches between non-switching and switching modes of operation in response to a bias control signal passing through a threshold value.

Thus, by enabling the amplifying elements to switch between non-switching and switching, the amplifier can operate at either a lower efficiency (non-switching) or a higher efficiency (switching). The lower efficiency mode is suited for lower power operation but enables more accurate control of power gain, whereas the higher efficiency mode is more suited to higher power operation. In this way, it is possible to operate over a larger power range without comprising accuracy of control of the power gain, and both the low power and medium power modes discussed above can be accommodated by the same amplifier module, which means also that the same RF output pin can be shared for the low and medium power modes. For the high power mode discussed above, only one external amplifier is required.

We have found that an amplifier according to the invention that is capable of switching between Class AB and Class E can achieve efficiencies of around 10% in Class AB and around 30% in Class E. Thus, in switching from Class AB (i.e. low power mode) to Class E (i.e. high power mode), the power drawn from the supply only increases by a factor of around 2 despite the fact that the RF power output increases by a factor of around 5.6.

Typical switching modes of operation are Class D and Class E, Class E being particularly preferred. Typical non-switching modes of operation are Class A, Class B, Class AB and Class C, Class AB being particularly preferred.

Typically, the or each amplifying element is coupled to a load via a reactive load network configured to yield a transient response whereby simultaneous imposition of substantial voltage across and substantial current through the or each amplifying element is avoided in the switching mode of operation and to present a load tuned to an operating frequency of the amplifier in the non-switching mode of operation. This arrangement is particularly well suited to use with Class E and Class AB as the switching and non-switching modes of operation respectively.

This reactive load network will typically comprise one or more inductors and one or more capacitors, and in one variant comprises a capacitor and inductor in parallel. The value of the capacitor in the reactive load network may be selected to achieve the desired transient response in the switching mode (e.g. Class E) of operation and to tune to the operating frequency of the amplifier in the non-switching (e.g. Class AB) mode of operation.

By stating that the "simultaneous imposition of substantial voltage across and substantial current through the or each amplifying element is avoided" we mean that the current through and voltage across the or each amplifying element are controlled by the reactive load network to ensure that there is no significant loss during a switching interval (i.e. when an amplifying element is actually switching on or off) of, for example, a Class E cycle of operation.

Preferably, the or each amplifying element comprises a first transistor, which is biased by the bias voltage to act as a switch in the switching mode of operation and as a linear or almost linear amplifier in the non-switching mode of operation.

In one embodiment, the or each amplifying element further comprises a second transistor in series with the first transistor, the second transistor being operable as a switch in response to a respective gain control signal for selectively coupling an amplifying element to a load. An advantage of providing a second transistor in series with the first transistor in the switching mode of operation is that high transient voltages that would be present at the drain of the first transistor in the absence of the second transistor will be shared between the two transistors. Hence, a lower voltage transistor can be used for the first transistor.

Thus, each amplifying element may be effectively enabled and disabled by its respective gain control signal. The act of disabling an amplifying element decouples the first transistor from the load, whereas enabling an amplifying element couples the first transistor to the load. The or each amplifying element is normally coupled to the load via a reactive load network such as that described above.

In this embodiment, the first and second transistor typically form a cascode arrangement when in the non-switching mode of operation.

In this embodiment, the amplifier may further comprise a third transistor switchable for diverting a portion of the current flowing through the first transistor to an alternating current (AC) ground node.

This third transistor will typically be switched in response to a respective gain control signal. It diverts a portion of the current flowing through the first transistor away from the load to the AC ground node. This allows a more granular control of power gain than simply enabling or disabling an amplifying element as achieved by the second transistor.

Typically, at least two amplifying elements are coupled in parallel.

In a preferred embodiment, the amplifier comprises first and second groups of amplifying elements, each having at least one amplifying element, wherein the first and second groups of amplifying elements are coupled in a differential arrangement. The invention may also be used with single-ended arrangements.

The amplifier typically further comprises a pre-amplifier for driving the or each amplifying element, the pre-amplifier being responsive to the bias control signal to switch between high and low gain modes when the or each amplifying element is in the switching and non-switching mode respectively.

In a first variant, the pre-amplifier comprises first and second pre-amplifying elements in parallel, the second pre-amplifying element being enabled in the high gain mode and disabled in the low gain mode.

The first and second pre-amplifying elements may each comprise input and output transistors arranged in cascode.

Thus, the output transistor of each of the first and second pre-amplifying elements may be biased into an inactive mode of operation by the bias control signal when in the low gain mode.

This is typically achieved by coupling the bias control signal to the gate of the output transistors causing them to cut-off and become effective open circuits.

In a preferred embodiment, the pre-amplifier comprises first and second groups of pre-amplifying elements, each having first and second pre-amplifying elements as defined above with respect to the first variant, wherein the first and second groups of pre-amplifying elements are coupled in a differential arrangement. The invention may also be used with single-ended arrangements.

In accordance with another aspect of the invention, there is provided an amplifier comprising a first transistor and a second transistor in series with the first transistor, the second transistor being operable as a switch in response to a gain control signal for selectively diverting a portion of the current flowing through the first transistor to an alternating current ground node.

This aspect of the invention achieves a more granular gain control than simply switching the first transistor on or off.

Typically, the second transistor is operable to divert the portion of the current flowing through the first transistor from a load to the alternating current ground node.

In accordance with yet another aspect of the invention, there is provided a transceiver system comprising an amplifier according to the first aspect, coupled to an aerial, and a low noise amplifier coupled to the aerial for amplifying a signal received by the aerial.

This aspect of the invention provides a simple way of implementing a transceiver using an amplifier according to the first aspect as the transmitter and a separate low noise amplifier as the receiver.

If a differential output from the amplifier according to the first aspect of the invention is provided then the coupling to the aerial may be made via a balun.

Similarly, the aerial may be coupled to the low noise amplifier via a balun, which may be the same one as the balun mentioned above.

Often, the amplifier according to the first aspect of the invention will be coupled to the aerial via a bandpass filter. This helps to control the harmonic content of the output signal, which may be required for regulatory compliance.

The amplifier according to the first aspect of the invention and/or the low noise amplifier may be enabled or disabled via respective control signals.

A low noise amplifier is used to amplify very weak signals in the receive mode. By "low noise amplifier", we mean an amplifier with a noise figure lower than 5 dB, preferably lower than 3 dB and even more preferably lower than 1 dB.

An example of the invention will now be described in detail with reference to the accompanying drawings, in which.

Figure 1:
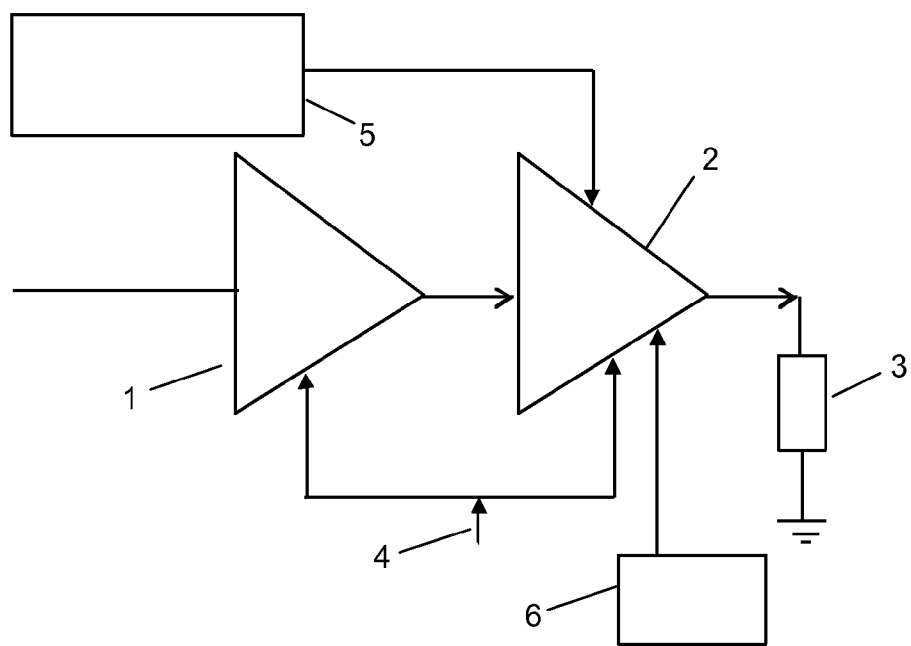
FIG. 1 shows a block diagram of an amplifier according to the invention.

FIG. 1 shows a pre-amplifier 1, which receives an RF input signal and amplifies it to a suitable level for driving a power amplifier output stage 2. The output stage 2 drives a load 3. A bias control signal 4 is used to switch the pre-amplifier 1 and output stage 2 between non-switching, Class AB in this case, and switching, Class E in this case, modes of operation. Typically, this will be a digital control signal where a binary 0 might be used to select Class AB and a binary 1 to select Class E, or vice-versa.

Control of the RF output power from output stage 2 in Class E is made by adjusting the voltage of power supply 5 as will be described below. In Class AB, power control is achieved by a different mechanism using a separate set of power control signals generated by power control circuit 6.

In Class AB operation the transistors in the output stage 2 are biased to conduct slightly during quiescent conditions and they conduct further when driven by an input signal. In any one cycle of the input waveform the transistors conduct for greater than 180° and less than 360°. In Class E operation the output transistors a switching technique is used, and the transistors are turned on and off. For this reason, different drive signal levels are required from the pre-amplifier 1 for each of the Class AB and Class E modes of operation. The pre-amplifier 1 is therefore switchable between high and low gain modes under the control of bias control signal 4. In the low gain mode (for Class AB operation) an output signal of about 500 mV peak is generated by the pre-amplifier 1, whereas in high gain mode (Class E operation) the output signal is around 2.5V peak. Since the gain mode of pre-amplifier 1 is selected by bias control signal 4, the gain mode of the pre-amplifier 1 is switched along with the class of operation of the output stage 2.

Figure 2:
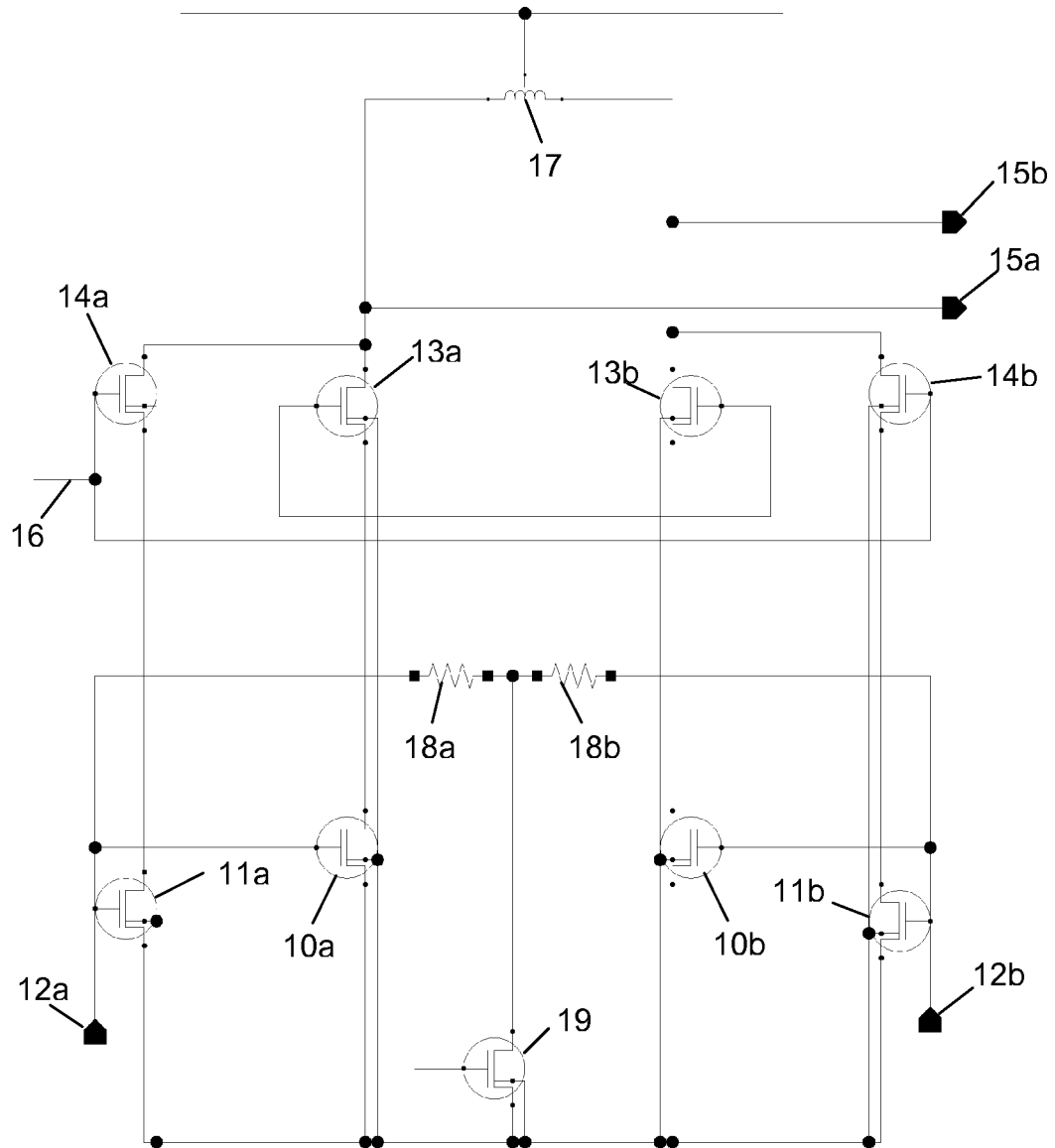
FIG. 2 shows a circuit diagram of a pre-amplifier stage of an amplifier according to the invention.

A suitable circuit for pre-amplifier 1 is shown in FIG. 2. This is an inductively-loaded differential amplifier with cascode outputs, tuned to be resonant at the operating frequency when loaded by output stage 2. As explained above, it is switchable between a low power mode for Class AB operation and a high power mode for Class E operation.

Pre-amplifier 1 comprises a first differential pair of input transistors 10a, 10b, and a second differential pair of input transistors 11a, 11b. The gates of input transistors 10a, 11a are coupled together, as are their sources. Similarly, the gates of input transistor 10b, 11b are coupled together, as are their sources. A differential input signal 12a, 12b is applied to the gates of input transistors 10a, 10b, 11a, 11b. Thus, signal 12a is coupled to the gates of input transistors 10a, 11a, and signal 12b is coupled to the gates of input transistors 10b, 11b. The sources of all the input transistors are coupled to ground.

A DC bias voltage is applied to the junction of resistors 18a, 18b, which biases transistors 10a, 10b, 11a, 11b. The signal 12a, 12b is superimposed on this DC bias voltage at the gates of input transistors 10a, 10b, 11a, 11b, provided the driving source has a resistance much lower than the value of the resistors 18a, 18b. A transistor 19 is provided, which disables the pre-amplifier when switched on by pulling the junction of resistors 18a, 18b where the DC bias voltage is applied to ground.

The drain of each of input transistors 10a, 10b, 11a, 11b is coupled to the source of a respective output transistor 13a, 13b, 14a, 14b. Thus, each input transistor 10a, 10b, 11a, 11b forms a cascode pair with a respective one of the output transistors 13a, 13b, 14a, 14b.

The gates of output transistors 13a, 13b are coupled together, as are the gates of output transistors 14a, 14b.

The drains of output transistors 13a, 14a are coupled together and to one terminal of an inductive load 17, whereas the drains of output transistors 13b, 14b are coupled together and to the other terminal of inductive load 17. A differential output signal 15a, 15b is taken from the two terminals of the inductive load 17. As mentioned above, the inductance value of inductive load 17 is selected to achieve resonance at the operating frequency when loaded by output stage 2.

In the high gain mode the gates of the output transistors 13a, 13b, 14a, 14b are all biased to a suitable voltage for each of the transistors to be operating in an activate region (i.e. they all respond to amplify an input signal).

However, in the low gain mode, the gates of output transistors 14a, 14b are pulled to a suitably low potential such that output transistors 14a, 14b and input transistors 11a, 11b no longer conduct during any part of the input signal waveform. This is achieved by coupling a gain select terminal 16 controlled by the bias control signal 4 to ensure that the bias is present only when the Class E mode of operation is selected. Thus, only output transistors 13a, 13b and input transistors 10a, 10b are active in the low gain mode and a lower gain is achieved.

The circuit topology shown in FIG. 2 ensures that the input load impedance is similar in both high and low gain modes since the same number input of transistors 10a, 10b, 11a, 11b are always present. Thus, when driven from a voltage-controlled oscillator (VCO) directly, the VCO will remain in range without retuning it for each of the high and low gain modes.

Similarly, the output impedance is maintained at a constant value for both high and low gain modes since the same number of cascode output transistors 13a, 13b, 14a, 14b are present at the output in both modes. This is required if the pre-amplifier 1 output is to resonate with the input of output stage 2.

Figure 3:
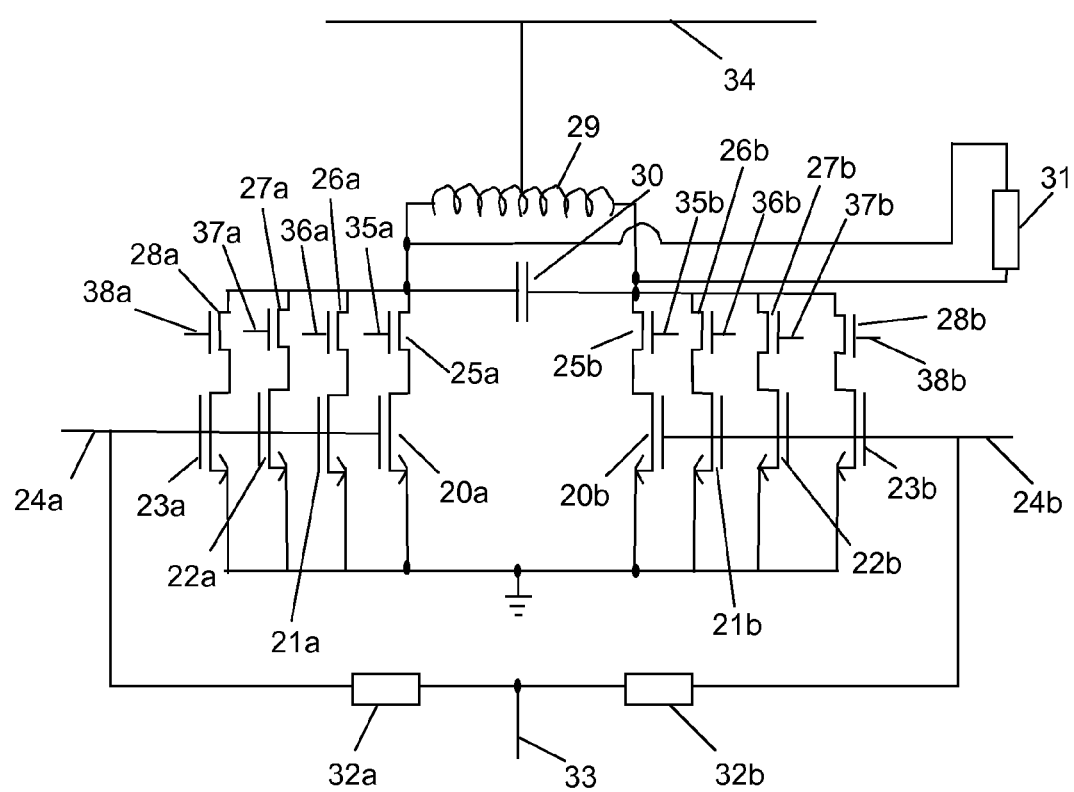
FIG. 3 shows a circuit diagram of an output stage of an amplifier according to the invention.

FIG. 3 shows a circuit diagram for the output stage 2. In this four pairs of input transistors are provided as shown by reference numerals 20a, 20b, 21a, 21b, 22a, 22b, 23a, and 23b. Each pair 20a, 20b; 21a, 21b; 22a, 22b; and 23a, 23b forms a differential input to the output stage 2. The sources of transistors 20a, 20b, 21a, 21b, 22a, 22b, 23a, 23b are all coupled to ground. The gates of transistors 20a, 21a, 22a, 23a are all coupled to an input pin 24a, whereas the gates of transistors 20b, 21b, 22b, 23b are all coupled to an input pin 24b. Together input pins 24a, 24b form a differential input, which is AC coupled (via capacitors) to the differential output signal 15a, 15b of pre-amplifier 1.

Each input transistor 20a, 20b, 21a, 21b, 22a, 22b, 23a, 23b is coupled via its drain to the source of a respective output transistor 25a, 25b, 26a, 26b, 27a, 27b, 28a, 28b. The drains of output transistors 25a, 26a, 27a, 28a are coupled to one terminal of a reactive load network comprising the parallel combination of inductor 29 and capacitor 30. The drains of output transistors 25b, 26b, 27b, 28b are coupled to the other terminal of the reactive load network. A centre-tap of inductor 29 is coupled to the supply voltage 34. The two terminals of the reactive load network are coupled to a load 31.

The value of capacitor 30 is selected such that the reactive load network is configured to yield a transient response whereby simultaneous imposition of substantial voltage across and substantial current through input transistors 20a, 20b, 21a, 21b, 22a, 22b, 23a, 23b is avoided in the Class E mode of operation and to present a load tuned to an operating frequency of the amplifier in the Class AB mode of operation.

The input pins 24a, 24b (and hence the gates of input transistors 20a, 20b, 21a, 21b, 22a, 22b, 23a, 23b) are coupled via resistors 32a, 32b respectively to a biasing terminal 33, the voltage on which is controlled by the bias control signal 4 such that no or very little bias is present when in the Class E mode of operation The gate of each of output transistors 25a, 25b, 26a, 26b, 27a, 27b, 28a, 28b is coupled to a respective gain control signal 35a, 35b, 36a, 36b, 37a, 37b, 38a, 38b, the purpose of which will be explained below.

To place the output stage 2 in Class E mode, the bias control signal 4 is driven such that no or very little bias is present on the biasing terminal 33. This causes input transistors 20a, 20b, 21a, 21b, 22a, 22b, 23a, 23b to act as switches, switching as the differential input signal 24a, 24b varies as is required for Class E operation. The gate of each of output transistors 25a, 25b, 26a, 26b, 27a, 27b, 28a, 28b is biased using gain control signals 35a, 35b, 36a, 36b, 37a, 37b, 38a, 38b to switch on the output transistors 25a, 25b, 26a, 26b, 27a, 27b, 28a, 28b so that current flowing through the input transistors flows directly to the reactive load network. The gain control signals 35a, 35b, 36a, 36b, 37a, 37b, 38a, 38b are generated by the power control circuit 6 depending on the output power required.

Control of the output power in Class E mode is achieved by varying the supply voltage 34 by controlling the supply voltage from power supply 5. This makes use of the principle that the output power is proportional to the square of the supply voltage for a fixed load, and it is possible to achieve control of the output power in 1 dB steps in this way.

To place the output stage 2 in Class AB mode, the bias control signal 4 is driven such that a suitable bias voltage is present on the biasing terminal 33 to bias the input transistors 20a, 20b, 21a, 21b, 22a, 22b, 23a, 23b via resistors 32a, 32b to be in a linear, active region of operation.

Control of the output power in Class AB mode is achieved by selecting which of input transistors 20a, 20b, 21a, 21b, 22a, 22b, 23a, 23b will contribute to the current flowing through the reactive load network. This is controlled by selectively switching on or off output transistors 25a, 25b, 26a, 26b, 27a, 27b, 28a, 28b using gain control signals 35a, 35b, 36a, 36b, 37a, 37b, 38a, 38b. Thus, for example by switching off output transistors 25a, 25b using gain control signals 35a, 35b, no current will flow through the associated input transistors 20a, 20b into the reactive load network, and the output power is therefore reduced.

To simplify the switching of the output transistors 25a, 25b, 26a, 26b, 27a, 27b, 28a, 28b, the gain control signals are often coupled together in pairs. Thus gain control signals 35a, 35b are coupled together, as are gain control signals 36a and 36b, 37a and 37b, and 38a and 38b.

In the Class AB mode of operation, the gain control signals 35a, 35b, 36a, 36b, 37a, 37b, 38a, 38b for those output transistors 25a, 25b, 26a, 26b, 27a, 27b, 28a, 28b that are switched on are used to bias the gates of the switched on output transistors 25a, 25b, 26a, 26b, 27a, 27b, 28a, 28b such that they form cascode pairs with the input transistors 20a, 20b, 21a, 21b, 22a, 22b, 23a, 23b.

Each of the input transistors 20a, 20b, 21a, 21b, 22a, 22b, 23a, 23b is sized to be the quarter of the size of a conventional transistor used in the output stage of an RF amplifier. Thus, the combination of input transistors 20a, 21a, 22a, 23a and of input transistors 20b, 21b, 22b, 23b provides the same gain (and hence, output power) as such a conventional transistor.

As a result, disabling any pair of input transistors 20a and 20b, 21a and 21b, 22a and 22b, or 23a and 23b will decrease the output power by 6 dB.

In alternative embodiments, the input transistors 20a, 20b, 21a, 21b, 22a, 22b, 23a, 23b may not be equally-sized but may have their sizes selected to provide differently-sized steps of output power control. For example, disabling the pair of input transistors 23a and 23b may cause a 3 dB decrease, whereas disabling the pair of input transistor 22a and 22b may cause a 6 dB decrease.

Figure 4:
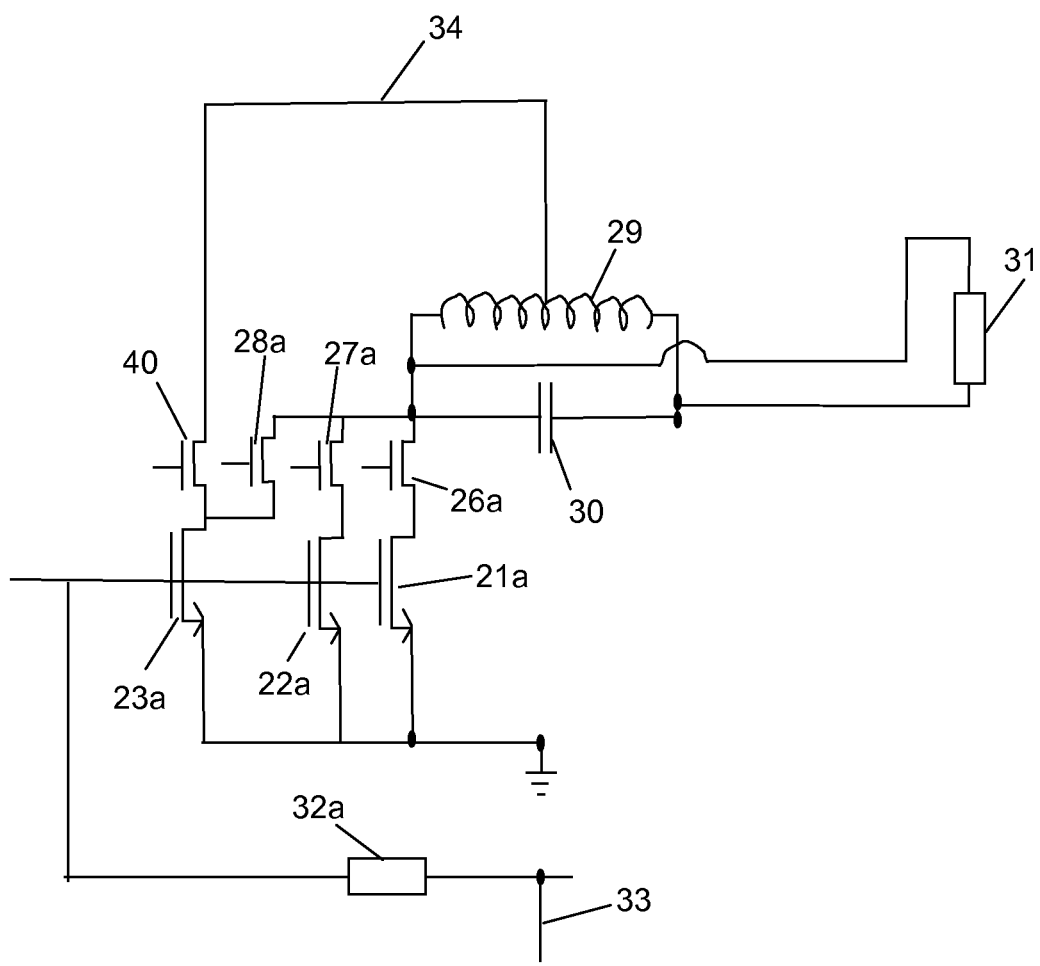
FIG. 4 shows an embellishment of the output stage of FIG. 3 for more granular gain control.

The input impedance of the output stage 2 does not vary significantly as the output power is varies since the number of input transistors 20a, 20b, 21a, 21b, 22a, 22b, 23a, 23b remains the same.

Where it is desired to achieve control of output power in steps smaller than is practically possible by switching a single transistor on or off, the technique of FIG. 4 may be used. In this, a portion of the circuit of FIG. 3 is shown along with an additional transistor 40 coupled in series with input transistor 23a. Whereas output transistor 28a is used to control whether current from input transistor 23a flows to the reactive load network, the additional transistor 40 is used to divert a portion of the current from input transistor 23a to the supply or other AC ground. The additional transistor 40 is controlled by power control circuit 6, which provides a suitable bias to its base to switch it on or off to achieve a desired output power.

The proportion of current that is diverted by additional transistor 40 when it is switched on depends on the relative sizes of output transistor 28a and additional transistor 40. If they are equally sized then half the current from input transistor 23a will be diverted from the reactive load network to the supply. A more granular control of the size of the gain step is therefore available than can be provided simply by switching output transistor 28a. This technique can of course be used with any of the input transistors 20a, 20b, 21a, 21b, 22a, 22b, 23a, 23b, but has been shown with reference to input transistor 23a for ease of explanation. The gates of any such additional transistors are coupled to respective gain control signals to control switching of the additional transistors.

Figure 5:
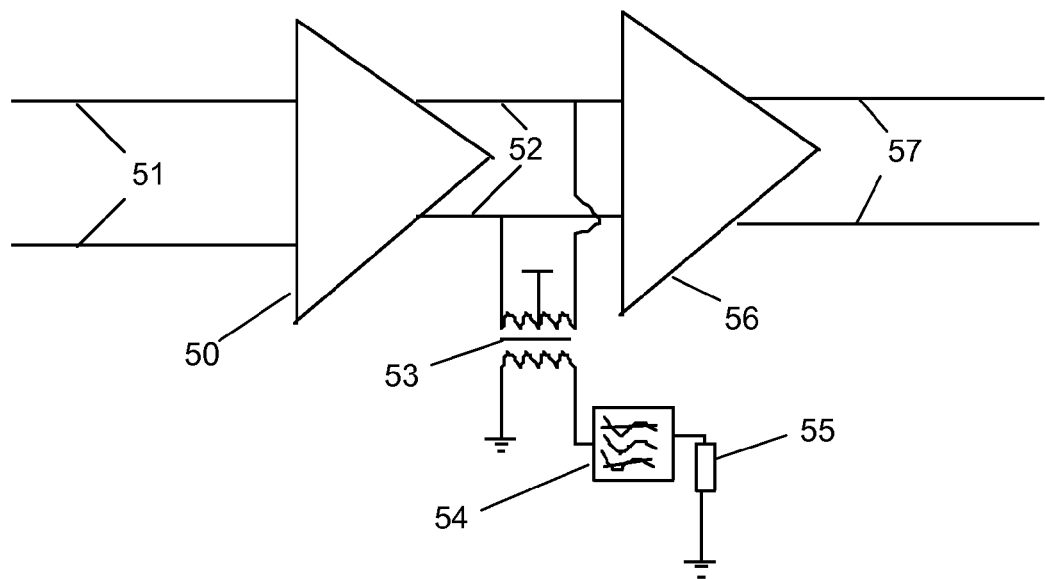
FIG. 5 shows a combination of an amplifier according to the invention with an external amplifier.

An application of the amplifier described above is shown in FIG. 5, where an amplifier 50 according to the invention is coupled to a differential input signal 51 to produce a differential output signal 52. The differential output signal 52 is switchable between low and high power modes as described above. The differential output signal 52 is coupled to a centre-tapped balun 53 (the centre-tap being coupled to the supply voltage 34), which is in turn coupled through a bandpass filter 54 to a load 55 such as an aerial. The bandpass filter 54 is provided to prevent the harmonic content of the signal coupled to the load 55 being excessive. An additional low noise amplifier 56 is provided, which acts as a receiver to amplify signals received at the load 55, which may be an aerial, and converted to a differential signal 52 by balun 53. Thus, amplifier 56 generates a higher power differential signal 57 from the differential signal 52 received by the load 55. Thus, the system of FIG. 5 is a transmitter and receiver. In a transmit mode, the amplifier 56 will be disabled and the amplifier 50 enabled, whereas in a receive mode, the amplifier 56 will be enabled and the amplifier 50 disabled.

Other variations to the disclosed embodiments can be understood and effected by those skilled in the art in practising the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. Any reference signs in the claims should not be construed as limiting the scope.

The invention claimed is:

1. An amplifier comprising:
   at least one amplifying element; and
   a biasing circuit configured to bias the at least one amplifying element with a bias voltage, wherein the biasing circuit is configured to vary the bias voltage such that the at least one amplifying element switches between switching and non-switching modes of operation in response to a binary bias control signal selecting either switching mode of operation or the non-switching mode of operation; and
   wherein at least two amplifying elements are coupled in parallel.

2. The amplifier according to claim 1, wherein the at least one amplifying element is coupled to a load via a reactive load network configured to yield a transient response whereby simultaneous imposition of substantial voltage across and substantial current through the at least one amplifying element is avoided in the switching mode of operation and to present a load tuned to an operating frequency of the amplifier in the non-switching mode of operation.

3. The amplifier according to claim 1, wherein the at least one amplifying element comprises:
   a first transistor, which is biased by the bias voltage to act as a switch in the switching mode of operation and as a substantially linear amplifier in the non-switching mode of operation.

4. The amplifier according to claim 3, wherein the at least one amplifying element further comprises:
   a second transistor in series with the first transistor, the second transistor being configured as a switch in response to a respective gain control signal for selectively coupling the at least one amplifying element to a load.

5. The amplifier according to claim 4, wherein the first and second transistor form a cascode arrangement when in the non-switching mode of operation.

6. The amplifier according to claim 4, further comprising:
   a third transistor switchable for diverting a portion of the current flowing through the first transistor to an alternating current ground node.

7. The amplifier according to claim 1, comprising:
   first and second groups of amplifying elements, each having at least one amplifying element, wherein the first and second groups of amplifying elements are coupled in a differential arrangement.

8. The amplifier according to claim 1, further comprising:
   a pre-amplifier configured to drive the at least one amplifying element, the pre-amplifier being responsive to the binary bias control signal to switch between high and low gain modes when the at least one amplifying element is in the switching and non-switching mode respectively.

9. The amplifier according to claim 8, wherein the pre-amplifier comprises:
   first and second pre-amplifying elements in parallel, the second pre-amplifying element being enabled in the high gain mode and disabled in the low gain mode.

10. The amplifier according to claim 9, wherein the first and second pre-amplifying elements each comprise:
    input and output transistors arranged in cascode.

11. The amplifier according to claim 10, wherein the output transistor of each of the first and second pre-amplifying elements is biased into an inactive mode of operation by the binary bias control signal when in the low gain mode.

12. The amplifier according to claim 8, wherein the pre-amplifier comprises:
   first and second groups of pre-amplifying elements are coupled in a differential arrangement.

13. A transceiver system comprising The amplifier according to claim 1, coupled to an aerial, and a low noise amplifier coupled to the aerial for amplifying a signal received by the aerial.

14. The amplifier according to claim 1, wherein the switching mode of operation is a Class E mode of operation.

15. The amplifier according to claim 1, wherein the non-switching mode of operation is a Class AB mode of operation.

16. The amplifier according to claim 2, wherein the reactive load network is a parallel combination of an inductor and a capacitor.

17. The amplifier according to claim 6, wherein the third transistor is coupled in series with the first transistor.

* * * * *